United States Patent
Shih

(10) Patent No.: US 6,515,860 B1
(45) Date of Patent: Feb. 4, 2003

(54) CPU HEAT SINK FASTENER

(75) Inventor: Helen Shih, San Chung (TW)

(73) Assignee: AMCO TEC International Inc., Taipei Hsien (TW)

( * ) Notice: Subject to any disclaimer, the term of this patent is extended or adjusted under 35 U.S.C. 154(b) by 2 days.

(21) Appl. No.: 09/984,042

(22) Filed: Oct. 26, 2001

(51) Int. Cl.[7] ................................................. H05K 7/20
(52) U.S. Cl. .................. 361/704; 361/707; 361/710; 361/719; 361/720; 165/80.2; 165/185; 174/16.3; 257/718; 257/719; 257/727
(58) Field of Search ................................. 361/702–704, 361/707, 717–719; 257/718, 719, 726, 727; 174/16.1, 16.3; 165/80.3, 185

(56) References Cited

U.S. PATENT DOCUMENTS 5,473,510 A * 12/1995 Dozier, II .................... 361/719
5,880,930 A * 3/1999 Wheaton ..................... 361/690
5,883,782 A * 3/1999 Thurston et al. ............ 364/704
6,055,159 A * 4/2000 Sun ............................. 361/710
6,198,630 B1 * 3/2001 Cromwell ................... 361/704
6,223,815 B1 * 5/2001 Shibasaki .................... 165/185
6,282,093 B1 * 8/2001 Goodwin ..................... 361/704

* cited by examiner

Primary Examiner—Boris Chervinsky
(74) Attorney, Agent, or Firm—Troxell Law Office PLLC

(57) ABSTRACT

A CPU heat sink fastener having a four-foot seat for mounting a heat sink inserted outside a fastening seat on a mother-board for installing a CPU is characterized that a base plate is disposed in the lower aspect of the mother-board opposite to the four-foot seat to be respectively screwed through four through holes on the four corners on the four-foot seat as well as the mother-board and into screw holes on the base plate by means of screws; the structure assembled accordingly is capable of firmly installing the four-foot seat on the mother-board since the said four-foot seat is screwed to the base plate through the mother-board by means of screws.

3 Claims, 5 Drawing Sheets

CPU HEAT SINK FASTENER

BACKGROUND OF THE INVENTION

1) Field of the Invention

The present invention relates to a CPU heat sink fastener, more especially to a four-foot seat disposed on a CPU of a mother-board for installing a heat sink to be screwed to a base plate through the mother-board by means of screws for firmly installing the four-foot seat on the mother-board.

2) Description of the Prior Art

Accordingly, high heat is usually generated by the central process unit (CPU) of the computer during operation and it needs to be dissipated properly to eliminate the damaging on the CPU and to maintain the operation under normal temperature.

The conventional heat dissipation structure installed on the CPU has a heat sink disposed in the upper aspect thereof, furthermore, a heat dissipating fan is installed in the upper aspect of the heat sink; the heat generated from the CPU is absorbed by the heat sink and further diffused by the heat dissipating fan so as to lower the working temperature to allow the CPU to operate under a normal temperature.

However, the processing speed of the CPU is getting faster and the faster the processing speed is, the higher the heat is; therefore, the heat dissipating device installed on the CPU must have higher heat sink efficiency, otherwise the CPU will not work normally due to the heat generated or it might be even damaged.

Since the dimension of heat dissipating fan installed in the upper aspect of the heat sink usually corresponds with the area size of the CPU; the fan can only achieves a limited quantity of current flow but is unable to efficiently enhance the heat dissipation efficiency; therefore, the size of the heat dissipating fan for cooling has been enlarged to increase the quantity of current flow; however, the increased dimension is beyond the area to be used by the CPU; therefore, it is necessary to install another holder on the mother-board for disposing the heat dissipating fan.

The conventional holder for installing a larger heat dissipating fan, as shown in FIG. 5, has a four-foot seat (d) for installing a heat sink device (not shown in the Figure) inserted outside the fastening seat (c) mounted on the mother-board for installing the CPU (b); four expansion nails (e) go through the through holes (d1) on the four corners of the four-foot seat (d) and insert into the fastening hole (a1) on the mother-board (a) so as to fixedly install the four-foot seat (d) on the mother-board (a).

However, after the expansion nail (e) go through the fastening hole (a1) on the mother-board (a), a gap tends to exist between the said expansion nail (e) and the fastening hole (a1); that disables the four-foot seat (d) from being firmly installed on the mother-board (e) and easily causes the loosening situation to happen; that further disables the heat sink device (not shown in the Figure) installed on the four-foot seat (d) to be tightly pressed on the CPU (b) and to fail to absorb the heat generated from the CPU (b) so the heat dissipating efficiency thereof is reduced.

SUMMARY OF THE INVENTION

In view of the heretofore disadvantages of the expansion nails (e) fastened on the mother-board (a) for disposing a heat dissipating fan in a larger dimension on the four-foot seat (d) mounted on the computer mother-board (a), the inventor researched and designed an improved CPU heat sink fastener to have a four-foot seat for mounting a heat sink inserted outside a fastening seat on a mother-board for installing a CPU; it is characterized that a base plate is disposed in the lower aspect of the mother-board opposite to the four-foot seat for being respectively screwed through the through holes on the four corners of the four-foot seat as well as the mother-board and into the screw holes on the base plate by means of screws; the structure assembled accordingly is capable of firmly installing the four-foot seat on the mother-board since the said four-foot seat is screwed to the base plate through the mother-board by means of screws.

Therefore, the primary objective of the present invention is to provide a four-foot seat disposed on a CPU of a mother-board for installing a heat sink to be screwed to a base plate through the mother-board by means of screws for firmly installing the four-foot seat on the mother-board.

In order to enable a further understanding of the present invention, the brief description of the drawings below is followed by the detailed description of the preferred embodiment.

DETAILED DESCRIPTION OF THE PREFERRED EMBODIMENTS

Figure 1:
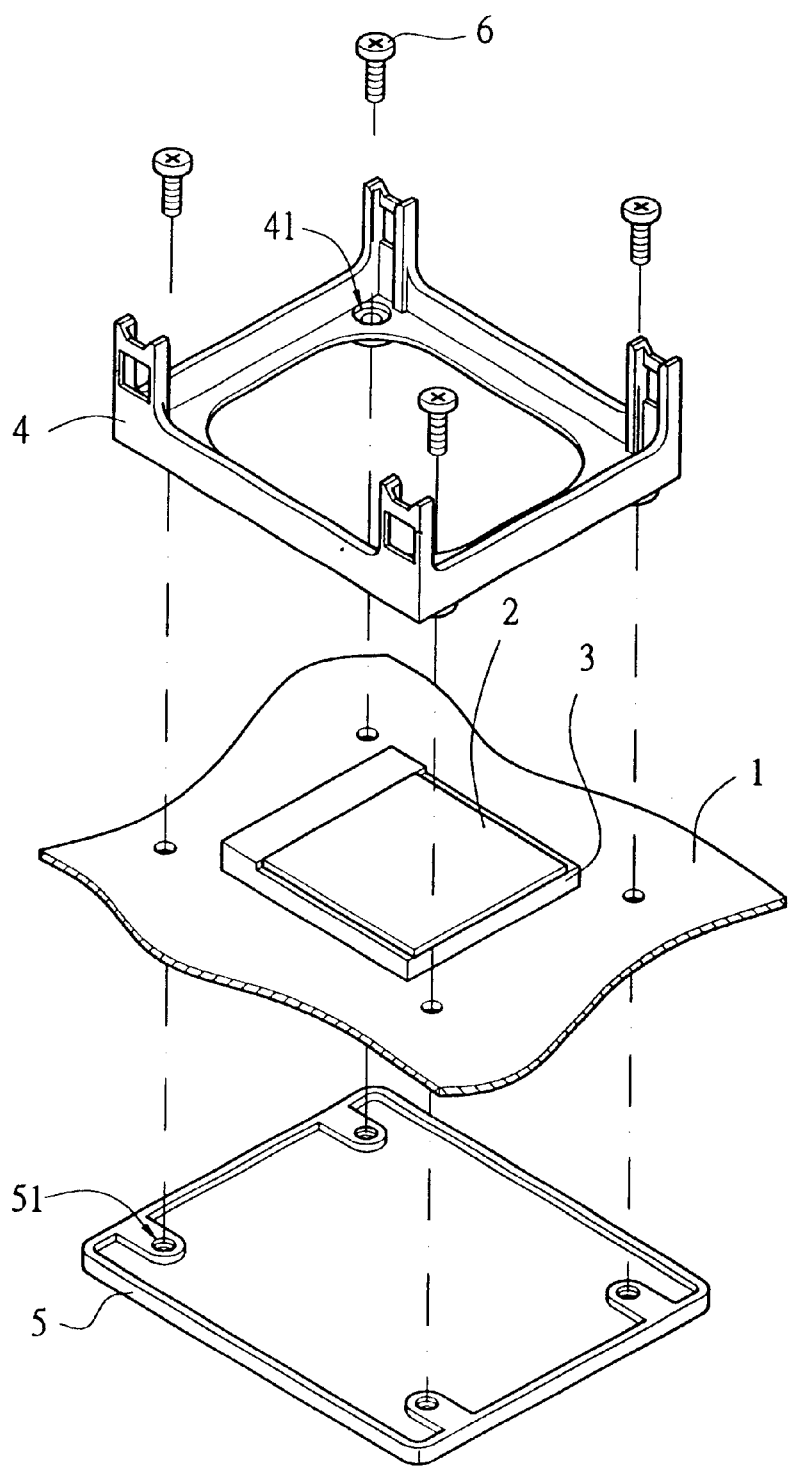
FIG. 1 is a pictorial and exploded drawing of the present invention.
Figure 2:
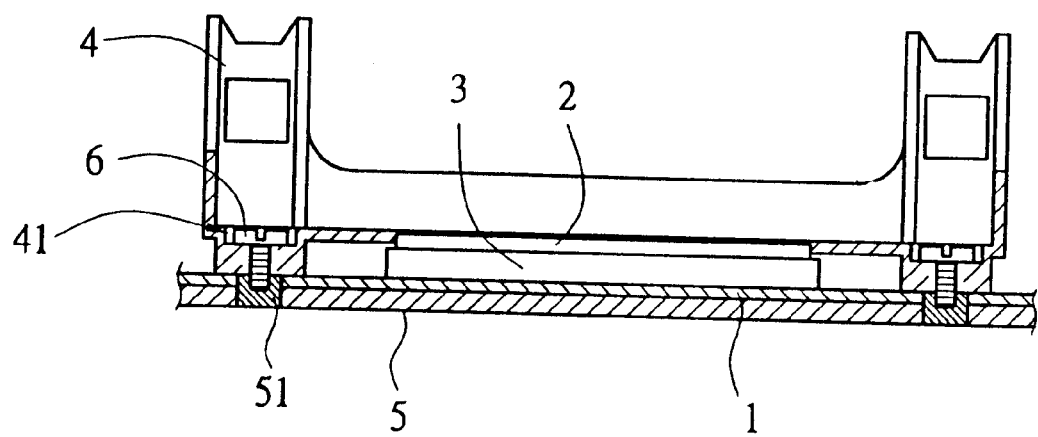
FIG. 2 is a cross-sectional view drawing of the assembled present invention.

Referring to FIGS. 1 and 2, the present invention comprising a four-foot seat (4) for mounting a heat sink (not shown in the Figure) inserted outside the fastening seat (3) on the mother-board (1) for installing a CPU (2) is characterized that a base plate (5) is disposed in the lower aspect of the mother-board (1) opposite to the four-foot seat (4) to be respectively screwed through the through holes (41) on the four corners on the four-foot seat (4) as well as through the mother-board (1) and into the screw holes (51) on the base plate (5) by means of screws (6) for firmly installing the four-foot seat (4).

Since a base plate (5) is disposed on the bottom plane opposite to the installing position of the four-foot seat (4) on the mother-board (1) and the said base plate (5) has four screw holes (51) corresponding to the four-foot seat (4) to permit the screws (6), after going through the through holes (41) on the four corners of the four-foot seat (4), to penetrate directly through the mother-board (1) and screw into the screw holes (51) on the base plate (5); thereby, the structure assembled accordingly uses the up and down clamping from the four-foot seat (4) and the base plate (5) toward the mother-board (1) to firmly install the four-foot seat (4) on the mother-board (1) to eliminate the loosening situation and to tightly press the said heat sink (not shown in the Figure) on the top plane of the CPU (2) for efficiently absorbing the heat generated by the CPU (2) so as to avoid any undesired heat dissipation condition.

Figure 3:
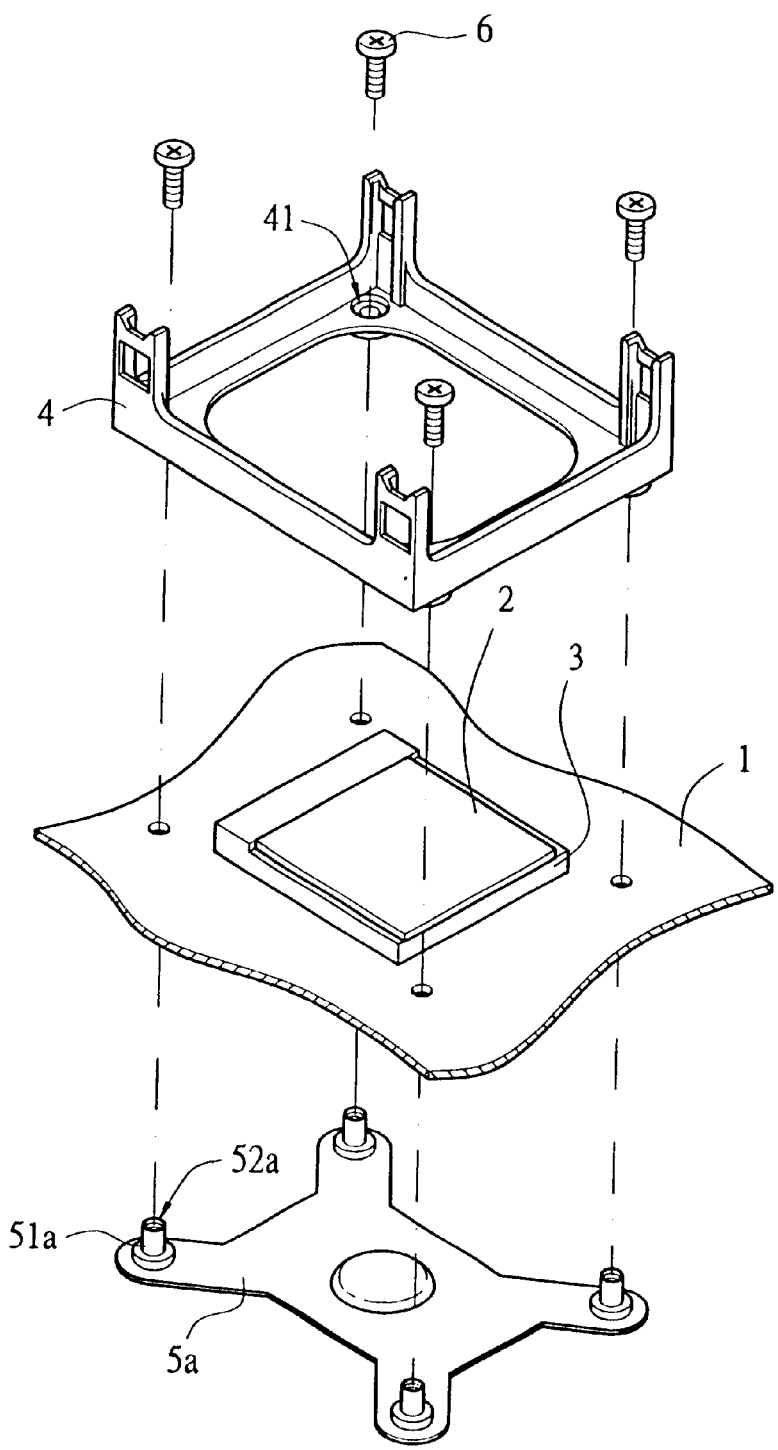
FIG. 3 is a pictorial and exploded drawing of another exemplary embodiment of the present invention.
Figure 4:
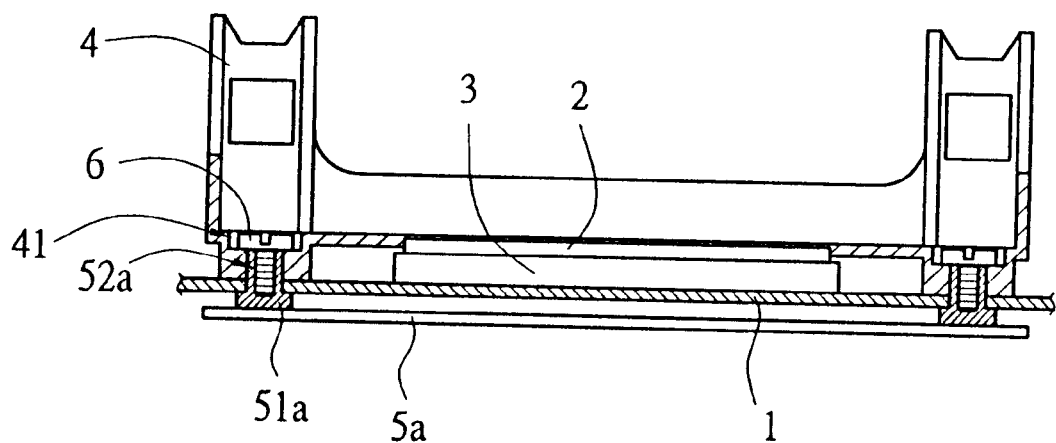
FIG. 4 is a cross-sectional view drawing of another assembled exemplary embodiment of the present invention.
Figure 5:
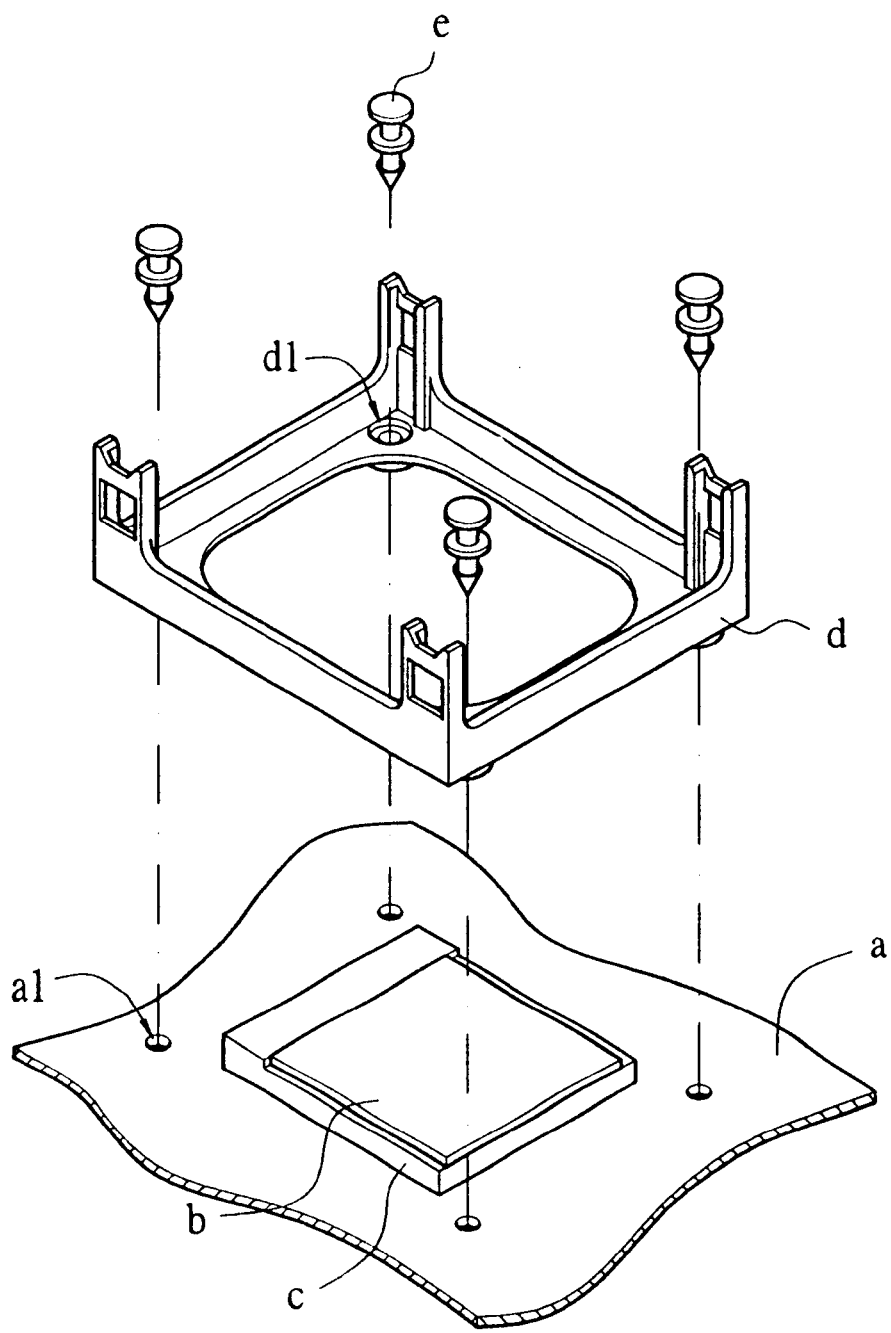
FIG. 5 is a pictorial and exploded drawing of a conventional structure.

Referring to FIGS. 3 and 4, the said base plate (5) can be designed as a metal piece (5a) with fixed corner posts (51a) on the four corners thereof; the top plane of the said corner post (51a) has the said screw hole (52a); the corner posts (51a) of the metal piece (5a) go through the mother-board (1), the said screws (6) penetrate respectively through the through holes (41) on the four corners of the four-foot seat (4) and screw into the screw holes (52a) on the top planes of the corner posts (51a) so that the four-foot seat (4) is fastened on the mother-board (1).

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. A heat sink fastener for mounting a heat sink on a first side of a motherboard having first and second opposite facing sides and comprising:

a) a plurality of holes through the motherboard;

b) a base plate located on the second side of the motherboard, the base plate including a plurality of corner posts extending therefrom, each corner post extending completely through the motherboard beyond the first side of the motherboard; and, c) a four-foot seat located adjacent to the first side of the motherboard and attached to the plurality of corner posts of the base plate.

2. The heat sink fastener of claim 1 wherein the corner posts extend from four corners of the base plate.

3. The heat sink fastener of claim 1 wherein each corner post has an end and a threaded opening extending into the corner post from the end.

* * * * *